(12) United States Patent
Hof

(10) Patent No.: US 9,964,862 B2
(45) Date of Patent: May 8, 2018

(54) APPARATUS AND METHOD FOR BEARING A LITHOGRAPHY MASK

(71) Applicant: Carl Zeiss SMT GmbH, Oberkochen (DE)

(72) Inventor: Albrecht Hof, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/357,177

(22) Filed: Nov. 21, 2016

(65) Prior Publication Data
US 2017/0153555 A1   Jun. 1, 2017

(30) Foreign Application Priority Data
Nov. 27, 2015   (DE) .......... 10 2015 015 423

(51) Int. Cl.
*G03F 7/20* (2006.01)
(52) U.S. Cl.
CPC .......... *G03F 7/707* (2013.01); *G03F 7/70691* (2013.01); *G03F 7/70733* (2013.01); *G03F 7/70758* (2013.01); *G03F 7/70775* (2013.01)
(58) Field of Classification Search
CPC ............. G03F 7/70758; G03F 7/70775; G03F 7/70691; G03F 7/707; G03F 7/70716; G03F 7/70733; G03F 7/70783; G03F 7/708; G03F 7/70808; G03F 7/70816; G03F 7/70825; G03F 7/70841; G03F 7/70866
See application file for complete search history.

(56) References Cited

U.S. PATENT DOCUMENTS

2005/0134829 A1* 6/2005 Ottens ............... G03F 7/707
355/75

FOREIGN PATENT DOCUMENTS

| JP | H11-204425 A | 7/1999 |
|---|---|---|
| JP | 2004-328014 A | 11/2004 |
| JP | 2008-103410 A | 5/2008 |
| KR | 2001-0009 997 A | 2/2001 |

OTHER PUBLICATIONS

German Office Action, with translation therein, for corresponding DE Appl No. 10 2015 015 423.0, dated Aug. 3, 2016.

* cited by examiner

*Primary Examiner* — Michelle M Iacoletti
(74) *Attorney, Agent, or Firm* — Fish & Richardson P.C.

(57) ABSTRACT

An apparatus for bearing a lithography mask with a reticle stage includes a resting support holder for the lithography mask. The resting support holder has bearing points which bear the lithography mask. Optionally, the resting support holder optionally has exactly four bearing points. An associated method adjusts the height of the fourth bearing point until all bearing points bear the same supporting force.

14 Claims, 4 Drawing Sheets

APPARATUS AND METHOD FOR BEARING A LITHOGRAPHY MASK

CROSS-REFERENCE TO RELATED APPLICATIONS

This application claims benefit under 35 U.S.C. § 119 of German Patent Application Number 10 2015 015 423.0, filed Nov. 27, 2015, the entire contents of which are incorporated by reference herein.

FIELD

The disclosure relates to an apparatus for bearing a lithography mask, including a reticle stage with a resting support holder for the lithography mask, wherein the resting support holder has bearing points which bear the lithography mask, as well as a related method.

BACKGROUND

So-called microlithographic projection exposure apparatuses are usually used for producing microstructured components such as e.g. integrated circuits or LCDs. In these apparatuses, the image of a lithography mask (=reticle) is projected onto a substrate (e.g. a silicon wafer) coated with a light-sensitive layer (photoresist) via a projection lens in order to transfer the mask structures onto the light-sensitive coating of the substrate. In the process, the lithography mask is displaced laterally with the aid of a so-called reticle stage in order also to successively image relatively large structures. By way of subsequent developing, etching and doping process, cost-effective large quantities of microstructured components may be achieved in this manner.

Here, the quality of the lithography mask plays a decisive role since an error in the mask structure propagates into the components emerging therefrom.

Therefore, complicated measurement apparatuses were developed, by which the mask structures may be measured after and during the production process of the lithography masks.

SUMMARY

Bearing the lithography masks both in the measurement apparatuses and in the projection exposure apparatuses becomes ever more important on account of the advancing miniaturization of the structure dimensions in the field of microlithography. This is because the bearing of the lithography mask determines, for example, the flexing thereof due to its inherent weight or the behavior thereof in view of disturbing vibrations.

Because three points always span a plane, lithography masks were previously borne by way of a three-point bearing. This helped prevent wobbling of the lithography mask. However, such a three-point bearing can have, in part, an inadequate behavior in relation to disturbing vibrations.

The disclosure seeks to provide an improved mount, in particular with a higher rigidity, for the lithography mask.

In one general aspect of the disclosure, an apparatus includes a resting support holder has four, in particular exactly four, bearing points which are arranged so that all bearing points bear the same supporting force.

The inventors have recognized that the behavior of the lithography mask in relation to disturbing vibrations is improved if the lithography mask is borne in such a way that the frequency of the first eigenmode of the lithography mask lies above the frequency of the first structure mode of the reticle stage. In general, in currently conventional reticle stages, the frequency of the first structure mode of the reticle stage lies at approximately 800 Hz.

The inventors have further recognized that a frequency of above approximately 800 Hz for the first eigenmode of the lithography mask is not reached in the case of the customary lithography masks with the known three-point bearing.

Therefore, the inventors developed an apparatus in which four bearing points bear the lithography mask such that the frequency of the first eigenmode of the lithography mask lies above the frequency of the first structure mode of the reticle stage.

Lithography masks typically are manufactured plane with an uncertainty of <1 µm. Flexing on account of gravity is also of this order of magnitude. Therefore, the bearing points should be matched in relation to the lithography mask in such a way that the supporting force, which may primarily be traced back to the gravitational force acting on the lithography mask, is approximately the same on the four bearing points within the scope of these uncertainties. Here, the same supporting force should be understood to mean supporting forces which differ from one another by less than 5%.

To this end, at least one of the bearing points may be height adjustable by way of an actuator.

Because three points always describe a plane, a single height-adjustable bearing point already facilitates matching of the bearing points in order to distribute the supporting force equally.

Even though very different actuators are conceivable, the actuator preferably has a piezo element with an adjustment range of up to 5 µm, in particular up to 20 µm, in particular up to 50 µm. Such piezo actuators are known and offer a sufficient accuracy. Thus, the resolutions of piezo actuators are a few nanometers, e.g. 10 nm, with adjustment dynamics of 1:2000.

Here, the apparatus may have an actuator measurement system, by which the movement of the actuator is captured in order to linearize the actuation thereof. In this manner, it is possible to compensate nonlinear properties, in particular of piezo actuators.

The apparatus may further include a proximity measuring device including a vibration device, by which a vibration may be superimposed onto the movement of the bearing point in the case of a height adjustment, and a capturing device, by which a power consumption of the actuator may be captured. In the case of such an apparatus, it is possible to superimpose a relatively small vibration movement onto the movement when driving up the height-adjustable bearing point from a position without a supporting force. There is a change in the vibration movement if the bearing point then approaches the lithography mask on account of the coupling to the lithography mask. This has an effect on the power consumption or the driver voltage of the actuator, which is captured with the aid of the capturing device, in order to determine the height with an equally distributed supporting force.

The apparatus may include a frequency response measuring device which may capture a transfer function of the reticle stage including the borne lithography mask as a response to a short stroke excitation.

In the three states—support on three fixed bearing points; support on four bearing points; support on two fixed bearing points and one height-adjustable bearing point—the lithography mask exhibits different eigenmodes which have an effect up into the transfer function of the mirror block of the reticle stage.

Therefore, it is possible to identify an occurrence or a breakdown of these eigenmodes when the reticle stage with the lithography mask borne therein is excited by way of a short stroke excitation and the transfer function is determined. In particular, this allows identification as to whether the frequency of the first eigenmode of the lithography mask lies above the frequency of the first structure mode of the mirror block.

Preferably, the frequency response measuring device includes at least one interferometer which cooperates with a mirror of a mirror block of the reticle stage. Because the reticle stage involves a mirror block, the mirrors of which cooperate with corresponding interferometers, for positioning the lithography mask, the components of a frequency response measuring device are already present.

The bearing points preferably have ruby spheres which are in direct contact with the lithography mask. As a result, a high rigidity of the bearing is achieved.

A method according to the disclosure for bearing a lithography mask in a reticle stage includes the following steps:
a) providing four, in particular exactly four, bearing points;
b) placing the lithography mask onto three of the four bearing points;
c) adjusting the height of the fourth bearing point until all bearing points bear the same supporting force.

Preferably, step b) includes the following steps in this case:
a) adjusting the height of the fourth bearing point with an actuator, in particular with a piezo actuator, into a position in which this bearing point bears no supporting force;
b) bringing the fourth bearing point closer to the lithography mask, with a vibration movement, in particular in and counter to the direction of approach, being superimposed onto the actuator;
c) capturing a power consumption of the actuator during the approach;
d) determining the height of the fourth bearing point at which the vibration movement couples to the lithography mask, from the power consumption of the actuator.

In this way, it is possible to ascertain the height of the height-adjustable bearing point at which the supporting forces are equally distributed among the four bearing points. Step b) may also include the following steps for the same purpose:
a) adjusting the height of the fourth bearing point with an actuator, in particular with a piezo actuator, into a position in which this bearing point bears no supporting force;
b) bringing the fourth bearing point closer to the lithography mask step-by-step, with a transfer function of the reticle stage being measured between two steps as a response to a short stroke excitation;
c) determining the height of the fourth bearing point at which the transfer function exhibits an eigenmode of a four-point-bearing with an equally distributed supporting force.

Because, with the mirror block of the reticle stage and the interferometers cooperating therewith, components of a frequency response measurement system, by which the transfer function may be determined, are already present, there is no need for the provision of any additional measurement systems. Moreover, the frequency behavior which is also decisive for the behavior in relation to disturbing vibrations, is used directly in this procedure for determining the ideal height of the fourth bearing point.

BRIEF DESCRIPTION OF THE DRAWINGS

Below, the disclosure is explained on the basis of exemplary embodiments, with reference being made to the drawings, in which.

DESCRIPTION OF PREFERRED EXEMPLARY EMBODIMENTS

Figure 1:
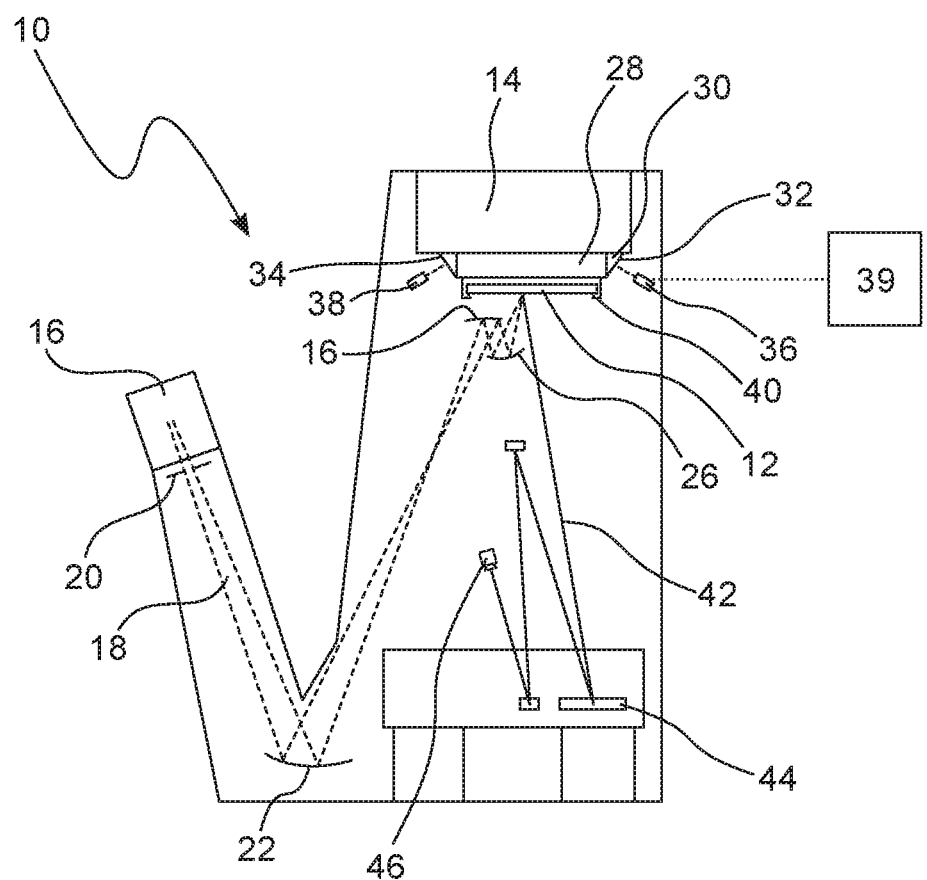
FIG. 1 shows a schematic illustration of a mask examination apparatus for checking microlithographic lithography masks.

FIG. 1 shows a mask examination apparatus, denoted by 10 overall, in which a microlithographic lithography mask 12 is arranged on a holding apparatus 14 for checking purposes.

The mask examination apparatus 10 includes an EUV light source 16 which generates an EUV light beam 18 used to examine the lithography mask 12.

Various beamforming elements, such as a stop 20 and concave mirrors 22, 24 and 26 are used to form the beam of the EUV light beam 18 and to direct the EUV light beam 18 to the lithography mask 12, which is held upside down in FIG. 1.

The holding apparatus 14 includes a reticle stage 28 to displace the lithography mask 12 along two scanning directions (from left to right and perpendicular to the plane of the drawing in FIG. 1) in order to laterally displace the lithography mask 12 in respect of the point of incidence of the EUV light beam 18. Moreover, the reticle stage 28 facilitates a height adjustment perpendicular to the two scanning directions.

A mirror block 30 is arranged on the movable part of the reticle stage 28, the mirror block in this case having obliquely arranged mirrors 32, 34 on the sides, the mirrors cooperating with of laser interferometers 36, 38 in order to determine the position of the movable part of the reticle stage 28. In a real system, the mirror block 30 has further mirrors (not shown here), which cooperate with further laser interferometers in order to measure all movement directions.

The laser interferometers 36, 38 are connected to a frequency response measurement system 39 such that it is possible to determine the transfer function of the movable part of the reticle stage 28, including the lithography mask 12, from the movements of the mirror block 30 after a short stroke excitation, i.e. after a short impulse excitation of the movable part of the reticle stage 28, for example with the aid of the reticle stage actuators.

Figure 2:
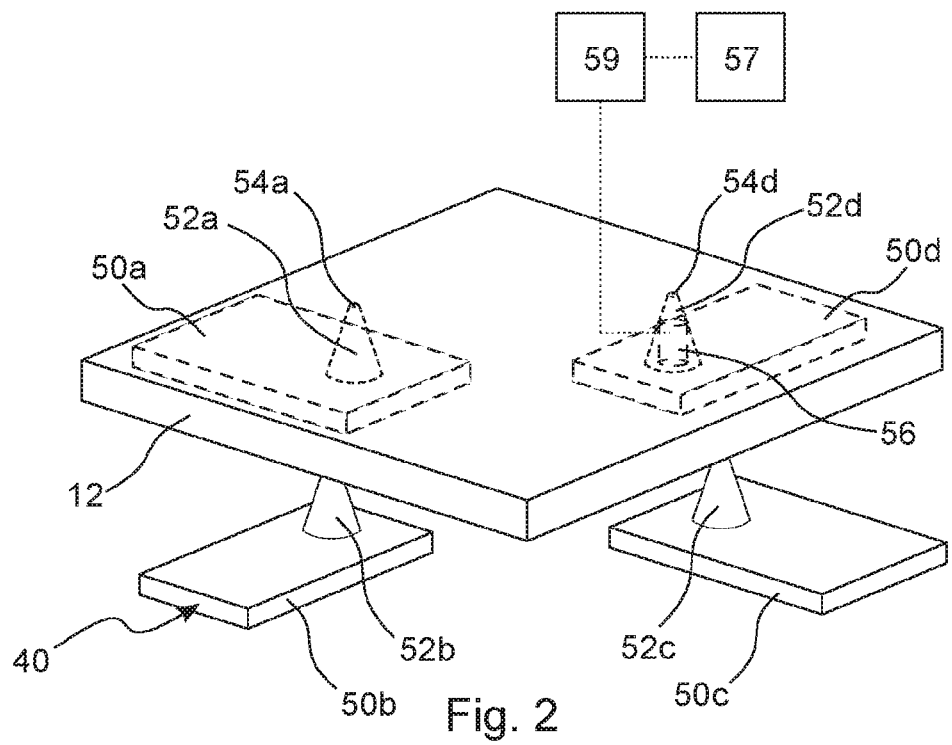
FIG. 2 shows a much simplified perspective view of a lithography mask which is supported by four bearing points of a reticle stage.

In order to hold the lithography mask 12, the reticle stage 28 includes a resting support holder 40, elements of which are shown in FIG. 2 and explained in more detail below. The EUV light 42 reflected downward by the lithography mask 12 is directed to an EUV CCD camera 46 via a mirror arrangement 44 in the further course of the beam path. The EUV CCD camera is used to capture the state of the lithography mask 12.

Because the structures to be measured on the lithography mask 12 are very small, it is desirable to ensure that possible disturbing vibrations influence the measurement as little as possible. In particular, the modal behavior of the lithography mask 12 is set by way of the configuration of the resting support holder 40 in such a way that the first eigenmode lies at a frequency that is as high as possible. In particular, this frequency should lie above the first structure mode of the reticle stage 28.

FIG. 2 shows elements of the resting support holder 40.

The resting support holder 40 has four carriers 50*a-d* which protrude inwardly from a frame (not shown here) of the reticle stage 28. Supporting tips 52*a-d* are respectively provided on the carriers 50*a-d* as bearing points for the lithography mask 12, wherein the supporting tips should have a rigidity that is as high as possible and are depicted as cones in this case. At the upper end thereof, the supporting tips 52*a-d* each carry a ruby sphere 54*a-d*, on which the lithography mask 12 then is borne.

The supporting tip 52*d* includes a piezo actuator 56, known per se, which may be used to adjust the height of the supporting tip 52*d*. Here, the piezo actuator 56 is connected in parallel with a known measurement system (not depicted in any more detail here) for linearizing the movement control.

For actuation purposes, the piezo actuator 56 is connected to a vibration device 57, which can be used to superimpose a vibration onto the movement of the piezo actuator 56 during a height adjustment. For the purposes of capturing the power consumption of the piezo actuator 56, a capturing device 59 is still interposed between the piezo actuator and the vibration device 57.

An overall rigidity emerges for the height-adjustable supporting tip 52*d* from the rigidity of the piezo material, the rigidity of the transition to the ruby sphere 54*a-d* and the rigidity of the ruby sphere 54*a-d*. Therefore, a rigidity of the transition which is as high as possible should be sought after by appropriate forming (Hertzian contact).

Figure 3:
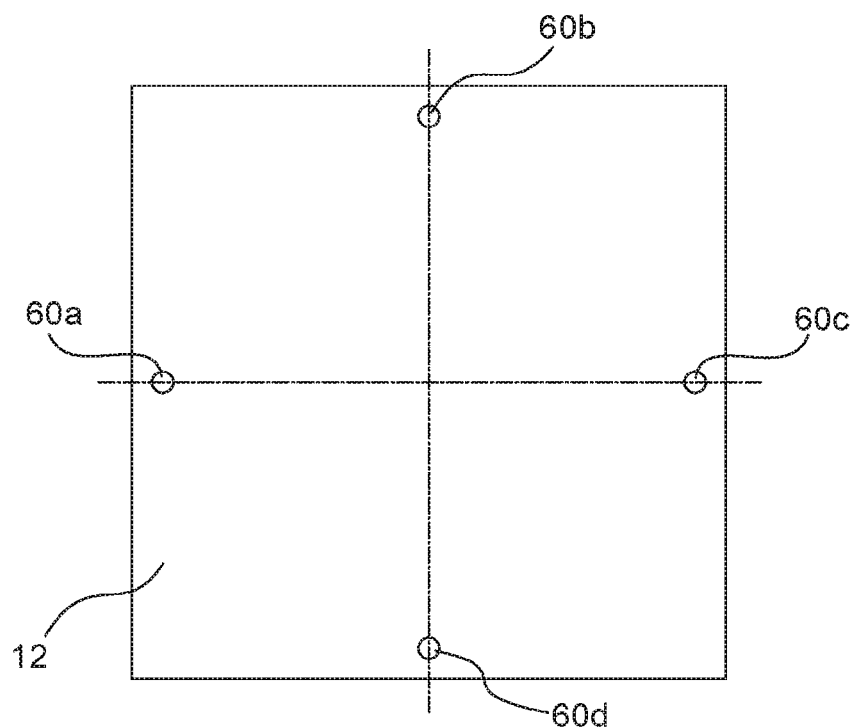
FIG. 3 shows a plan view of the lithography mask, from which the lateral positions of the four bearing points emerge.

As may be gathered from FIG. 3, the four supporting tips 52*a-d* are distributed laterally with the ruby spheres 54*a-d* thereof in such a way that the lithography mask 12 is borne at four supporting points 60*a-d* which are arranged at the center of the sides of the lithography mask 12, which is a square in this case. Here, the support is such that all four bearing points support the same supporting force.

Figure 4:
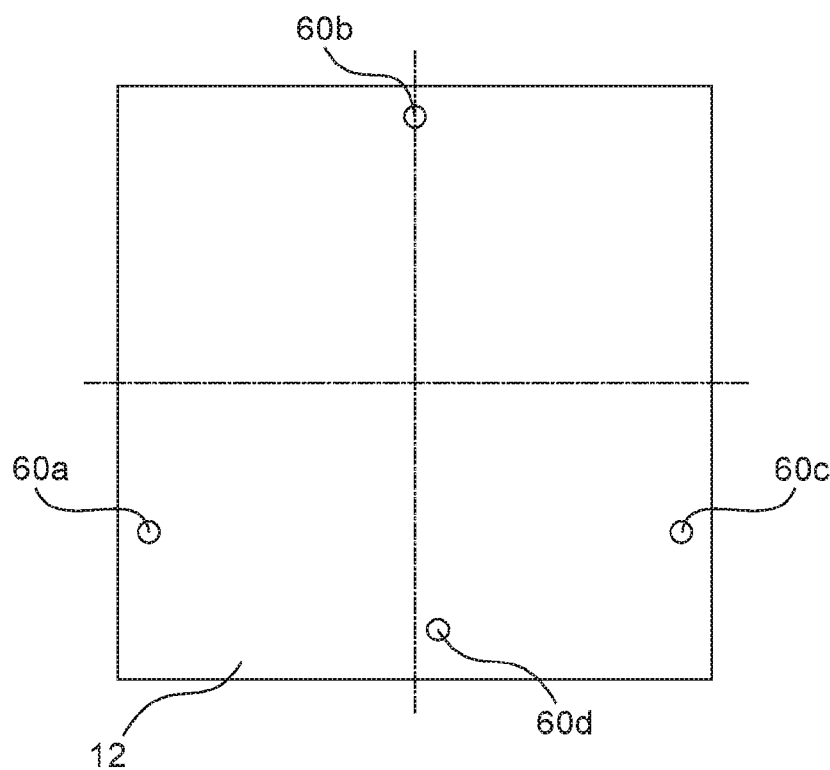
FIG. 4 shows a plan view of the lithography mask, from which modified positions of the four bearing points emerge.

Alternatively, the supporting points 60*a*-60*c* may be arranged in a ratio of 2:1 in accordance with FIG. 4. The fourth supporting point 60*d*, on which the height-adjustable supporting tip 52*d* rests, is arranged slightly outside of the center line of the lithography mask 12 here in order to avoid symmetry with the three-point bearing.

In order to set the height of the supporting tip 52*d* such that all four supporting tips 52*a-d* support the same supporting force, it is possible, for example, to use the two procedures explained below in an alternative or complementary manner.

Determining the Height of the Same Supporting Force Via a Proximity Measuring Device First, the height-adjustable supporting tip 52*d* is withdrawn with the aid of the piezo actuator 56 to such an extent that the supporting tip certainly does not abut against the lithography mask 12. Then, the piezo actuator 56 is made to vibrate with the aid of the vibration device 57 while being driven upward. In the process, the power consumption or the driver voltage of the piezo actuator 56 is monitored with the aid of the capturing device 59. If the supporting tip 52*d* approaches the lithography mask 12, the vibration couples with the lithography mask 12. This is identified by the capturing device 59, and so it is thereby possible to ascertain the ideal height for an equal distribution of the supporting force.

Determining the Height of the Same Supporting Force Via a Frequency Response Measuring Device:

Here too, the height-adjustable supporting tip 52*d* is withdrawn with the aid of the piezo actuator 56 to such an extent that the supporting tip certainly does not abut against the lithography mask 12. This state corresponds to a three-point support.

Figure 5:
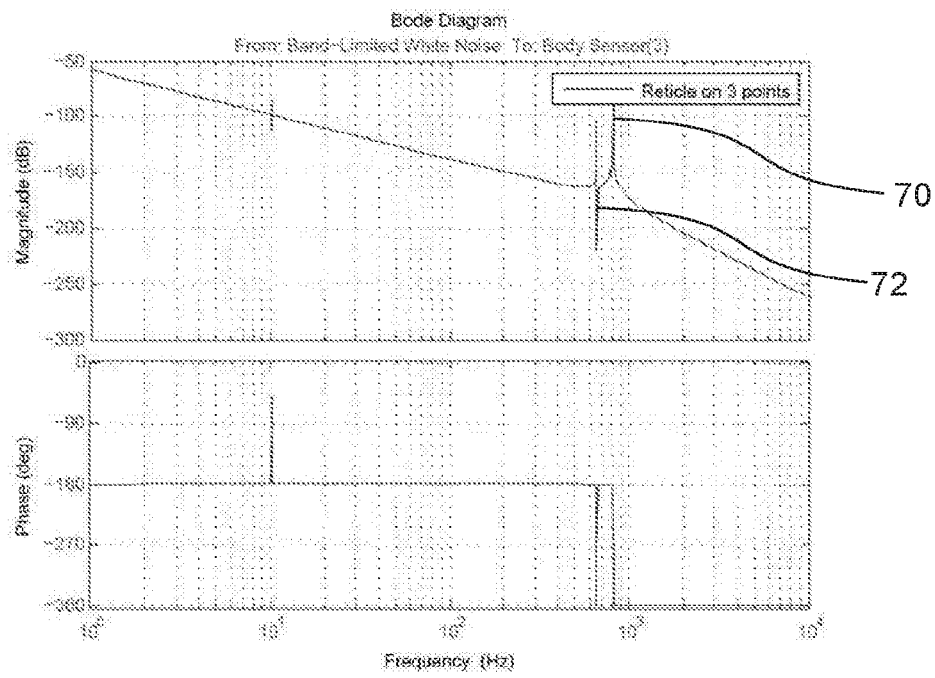
FIG. 5 shows a Bode diagram, which plots the frequency response of the lithography mask and the reticle stage for the case of a three-point bearing.

The transfer function depicted in the Bode diagram of FIG. 5 is determined with the aid of the frequency response measuring device 39, the interferometers 36, 38 and the mirrors 32, 34 of the mirror block 30.

As may be identified therein, the frequency of the first eigenmode 72 of the lithography mask 12 lies below the frequency of the first structure mode 70 of the mirror block 30 in this case.

Now, the supporting tip 52*d* is made to approach the lithography mask 12 step-by-step and the transfer function is determined in each case.

Figure 6:
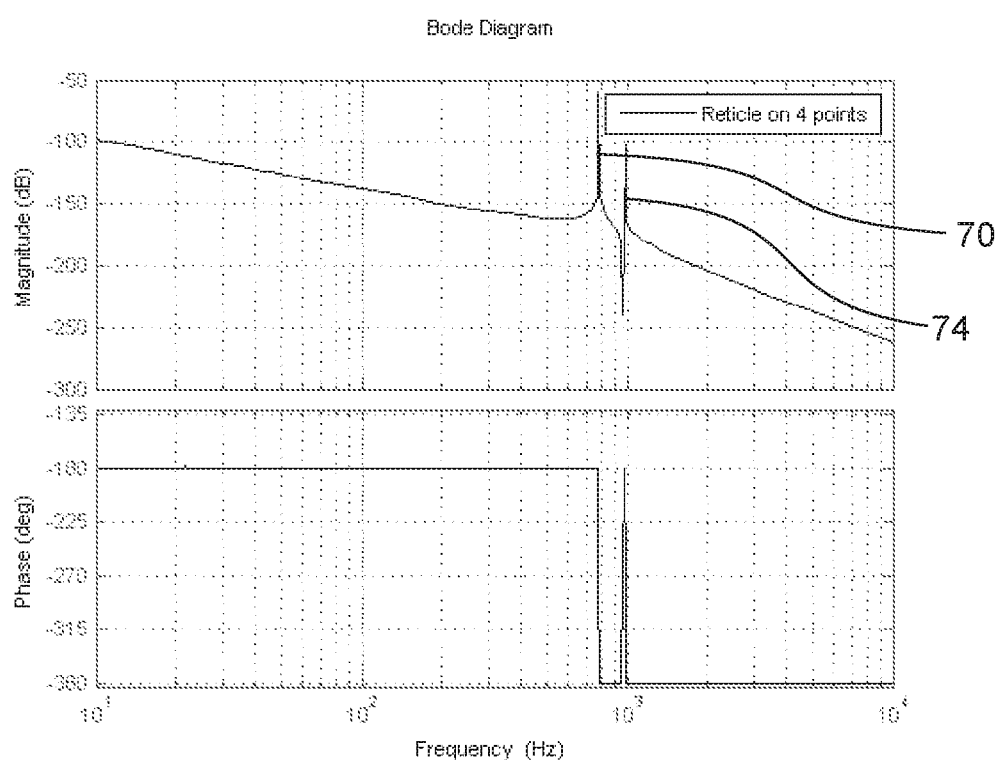
FIG. 6 shows a Bode diagram, which plots the frequency response of the lithography mask and the reticle stage for the case of a four-point-bearing.

When the height is reached at which the supporting force at all four supporting tips 52*a-d* is approximately the same (four-point support), the transfer function shown in the Bode diagram of FIG. 6 is obtained.

As may be identified therein, the frequency of the first eigenmode 74 of the lithography mask 12 lies above the frequency of the first structure mode 70 of the mirror block 30 in this case.

A lithography mask 12 borne thus has a higher rigidity, and so the behavior in relation to disturbances is improved because only relatively high disturbing vibrations, which usually have a smaller amplitude, lead to resonances in the system.

What is claimed is:

1. An apparatus, comprising:
a reticle stage comprising a resting support holder having exactly four bearing points configured to bear a lithography mask,
wherein the bearing points are arranged so that each bearing point bears the same supporting force, and
wherein the apparatus further comprises:
an actuator configured to adjust a bearing point;
a proximity measuring device which comprises a vibration device configured to superimpose a vibration onto a movement of the bearing point during height adjustment; and
a capturing device configured to capture power consumption of the actuator.

2. The apparatus of claim 1, wherein the actuator comprises a piezo element having an adjustment range of up to 5 μm.

3. The apparatus of claim 1, wherein the actuator comprises a piezo element having an adjustment range of up to 20 μm.

4. The apparatus of claim 1, wherein the actuator comprises a piezo element having an adjustment range of up to 50 μm.

5. The apparatus of claim 1, further comprising a frequency response measuring device configured to capture, as a response to a short stroke excitation, a transfer function of the reticle stage when the reticle stage is bearing the lithography mask.

6. The apparatus of claim 5, wherein the reticle stage further comprises a mirror block which comprises a mirror, and the frequency response measuring device comprises an interferometer configured to cooperate with the mirror of the mirror block.

7. A method, comprising:
placing a lithography mask on three of the bearing points of the apparatus of claim 1; and
adjusting a height of the fourth bearing point of the apparatus until all bearing points bear the same supporting force.

8. A method, comprising:
supporting a lithography mask with three bearing points of an apparatus which comprises four bearing points; and
adjusting a height of the fourth bearing point until all bearing points bear the same supporting force.

9. The method of claim 8, wherein the apparatus has exactly four bearing points.

10. The method of claim 9, comprising:
adjusting the height of the fourth bearing point with an actuator into a position in which the fourth bearing point bears no supporting force;
bringing the fourth bearing point closer to the lithography mask with a vibration movement superimposed onto the actuator;
capturing a power consumption of the actuator as the fourth bearing point approaches the lithography mask;
based on the captured power consumption of the actuator, determining the height of the fourth bearing point at which the vibration movement couples to the lithography mask.

11. The method of claim 9, comprising:
using an actuator to adjust the height of the fourth bearing point into a position in which this bearing point bears no supporting force;
bringing the fourth bearing point closer to the lithography mask in a step-by-step manner while measuring a transfer function of the reticle stage between two steps as a response to a short stroke excitation; and
determining the height of the fourth bearing point at which the transfer function exhibits an eigenmode of a four-point-bearing with an equally distributed supporting force.

12. The method of claim 8, comprising:
adjusting the height of the fourth bearing point with an actuator into a position in which the fourth bearing point bears no supporting force;
bringing the fourth bearing point closer to the lithography mask with a vibration movement superimposed onto the actuator;
capturing a power consumption of the actuator as the fourth bearing point approaches the lithography mask;
based on the captured power consumption of the actuator, determining the height of the fourth bearing point at which the vibration movement couples to the lithography mask.

13. The method of claim 8, comprising:
using an actuator to adjust the height of the fourth bearing point into a position in which this bearing point bears no supporting force;
bringing the fourth bearing point closer to the lithography mask in a step-by-step manner while measuring a transfer function of the reticle stage between two steps as a response to a short stroke excitation; and
determining the height of the fourth bearing point at which the transfer function exhibits an eigenmode of a four-point-bearing with an equally distributed supporting force.

14. An apparatus, comprising:
a reticle stage comprising a resting support holder having exactly four bearing points configured to bear a lithography mask,
wherein the bearing points are arranged so that each bearing point bears the same supporting force, and
wherein the apparatus further comprises:
an actuator configured to adjust a bearing point; and
a frequency response measuring device configured to capture, as a response to a short stroke excitation, a transfer function of the reticle stage when the reticle stage is bearing the lithography mask.

* * * * *

UNITED STATES PATENT AND TRADEMARK OFFICE
CERTIFICATE OF CORRECTION

PATENT NO. : 9,964,862 B2
APPLICATION NO. : 15/357177
DATED : May 8, 2018
INVENTOR(S) : Albrecht Hof Page 1 of 1

It is certified that error appears in the above-identified patent and that said Letters Patent is hereby corrected as shown below:

On the Title Page

Column 1, (Notice), Line 3, after "0 days." delete "days."

Signed and Sealed this
Twenty-third Day of October, 2018

Andrei Iancu
*Director of the United States Patent and Trademark Office*